United States Patent [19]
Menigaux et al.

[11] Patent Number: 4,648,940
[45] Date of Patent: Mar. 10, 1987

[54] PROCESS FOR MANUFACTURING A SEMICONDUCTOR LASER HAVING A BURIED RIBBON

[76] Inventors: Louis Menigaux, 85 Avenue des Tillelus, 91440 Bures sur Yvette; Pierre Sansonetti, 61 Chemin de la Vallée aux Coups, 92290 Chatenay Nalabry, both of France

[21] Appl. No.: 806,802

[22] Filed: Dec. 10, 1985

[30] Foreign Application Priority Data

Dec. 11, 1984 [FR] France ................................ 84 18900

[51] Int. Cl.$^4$ ................. H01L 21/306; H01L 21/205; H01L 21/22; B44C 1/22
[52] U.S. Cl. ................... 156/649; 29/569 L; 29/576 E; 29/580; 148/175; 148/186; 156/655; 156/659.1; 156/662; 357/16; 357/17; 357/56; 357/65
[58] Field of Search ............. 156/649, 659.1, 655, 156/662; 148/1.5, 175, 186; 29/569 L, 576 B, 576 E, 580; 357/16, 17, 56, 65, 66

[56] References Cited

U.S. PATENT DOCUMENTS

| | | | |
|---|---|---|---|
| 4,213,805 | 7/1980 | Tsukada | 156/649 X |
| 4,468,850 | 9/1984 | Liau et al. | 156/649 X |

*Primary Examiner*—William A. Powell
*Attorney, Agent, or Firm*—Oblon, Fisher, Spivak, McClelland & Maier

[57] ABSTRACT

Process for manufacturing a semiconductor laser having a buried ribbon. After making a double heterostructure (2, 3, 4, 5) on a substrate (1), there is implanted in the contact layer (5) a p-type doping material, which has the effect of rendering it amorphous. The unit, except for a ribbon, is etched which leaves a mesa. A resumption of epitaxy makes it possible to bury the channel. This resumption does not lead to a crystalline growth on the upper surface of the contact layer, although the annealing that takes place during the resumption of epitaxy gives good ohmic contacts at the level of the implanted layer.

3 Claims, 2 Drawing Figures

PROCESS FOR MANUFACTURING A SEMICONDUCTOR LASER HAVING A BURIED RIBBON

This invention has as its object a process for manufacturing a semiconductor laser having a buried ribbon. It has an application in optical telecommunications.

The technical field of the invention is that of semiconductor lasers known as double heterostructure and ribbon-shaped junction. This structure consists of a stack of semiconductive layers deposited by epitaxy on a monocrystalline substrate. In general, starting with a substrate, there is a first confinement layer, an active layer, a second confinement layer and a contact layer covered with a metal layer. The double heterostructure feature comes from the fact that the active layer is sandwiched by two layers whose composition is different from that of the active layer.

For lasers emitting between 0.8 and 0.9 um, the confinement layers are of $Ga_{1-x}Al_xAs$ alloy and the active layer and the substrate are of GaAs; for lasers emitting between 1.3 and 1.65 μm, the confinement layers and the substrate are of InP and the active layer of $Ga_{1-x}In_x$-$As_{1-y}P_y$.

Figure 1:
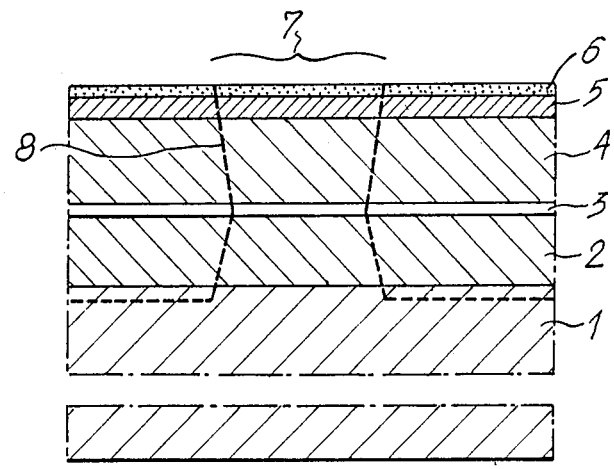

To facilitate the continuous operation and to lower the threshold current, there is recourse to a technique known as buried ribbon (or abbreviated "BH" for "buried-heterostructure"). FIG. 1 diagrammatically shows the process that makes it possible to produce this device. It is begun by making, by epitaxy on substrate 1 of n+-type GaAs (for example), a double heterostructure which comprises a first confinement layer 2 of N-type $Ga_{1-x}Al_xAs$ with x=0.3 and with a thickness on the order of 1 μm; an active layer 3 of intentionally non-doped GaAs, 0.2 μm thick; a second confinement layer 4 of P-type $Ga_{1-x}Al_xAs$, 1 μm thick, and finally a contact layer 5 of p+-type GaAs, 0.5 μm.

Naturally, the GaAs/GaAlAs compounds are not the only ones possible and InP/InGaAsP or other ternary or quaternary compounds can also be used.

A traditionally used technique then consists in covering the unit with an insulating material 6, such as silicon nitride ($Si_3N_4$) or silicon dioxide ($SiO_2$). A ribbon 7 is then delimited by photolithography. A mesa is then made by etching through this ribbon to the substrate (dashes 8). The etching is generally made in direction <110> to have a minimal active zone width.

To bury the active layer, there must then be a growth of N−-type $Ga_{1-z}Al_zAs$ with z>x so that there is optical as well as electrical confinement. P-type and then n-type $Ga_{1-z}Al_zAs$ can also be made to grow successively to have a blocking junction. For this purpose, insulating material 7 is left on the mesa, an etching is performed, then a growth of $Ga_{1-z}Al_zAs$ generally by liquid epitaxy; the growth takes place on substrate 1, on both sides of the mesa but not on insulating material 7. It then remains to cover the unit with insulating material, to make openings by photolithography and to make ohmic contacts on the base of the substrate and in the openings.

This technique is described in an article by W. T. Tsang and R. A. Logan published in the magazine "IEEE Journal of Quantum Electronics," vol. QE-15, No. 6, 1979, pp 451–469.

Another technique consists in not using a contact layer of GaAs. Since the crystalline growth does not take place on a layer of $Ga_{1-x}Al_xAs$ with x>0.2, there is further obtained a growth only on both sides of the mesa and consequently the same buried structure. However, it is then necessary to resort to a local diffusion of zinc to have a good ohmic contact on the $Ga_{1-x}Al_xAs$.

This second technique is described in the article by T. Tsukada published in the magazine "Journal of Applied Physics," vol. 45, No. 11, November 1974, pp 4899–4906.

The problem of the first technique is linked to the difficulty of obtaining an insulating material ($Si_3N_4$ or $SiO_2$) which holds up well at high temperature which is that of the epitaxy during the growth. This temperature is on the order of 800° C. in the case of GaAs.

The problem of the second technique is linked to the diffusion of zinc (generally in sealed ampule) that must be performed locally through openings made in an insulating material resistant to diffusion temperatures which are on the order of 700° C. for GaAs.

The object of the invention is to simplify the manufacturing process by using neither depositing of insulating material nor localized diffusion of zinc after resumption of epitaxy.

For this purpose, a double heterostructure is first made according to the first technique (FIG. 1) but without depositing insulating material 6. Then an implantation is performed in contact layer 5 by using a p-type doping material so that the upper surface becomes amorphous. This implantation takes place over the entire surface of the layer. A mesa is then made by etching through ribbons of resin made by photolithography. Then the resin is removed. Then the resumption of epitaxy is undertaken on the substrate. Two cases then have to be distinguished:

(1) If the resumption of epitaxy is undertaken in liquid phase, the growth does not take place on the top of the mesa. Since liquid epitaxy takes place at high temperature, an annealing of the implanted zone with restoration of its electrical properties is obtained at the same time, but the annealing does not make the implanted layer crystalline enough to make a growth possible on the top of the mesa; thus, there is obtained directly a strongly doped contact layer making an excellent ohmic contact and a laser having a buried ribbon.

(2) If the resumption of epitaxy is undertaken by OMCVD ("Organo Metallic Chemical Vapor Deposition"), the growth is monocrystalline. However, on the top of the mesa there is a very dislocated region between implanted layer and growth layer. After resumption of epitaxy, it is then enough to cause this dislocated layer to disappear by etching with hydrofluoric acid and ultrasound. A buried laser is thus obtained. A similar technology could be applied with an epitaxial growth by molecular jet.

Figure 2:
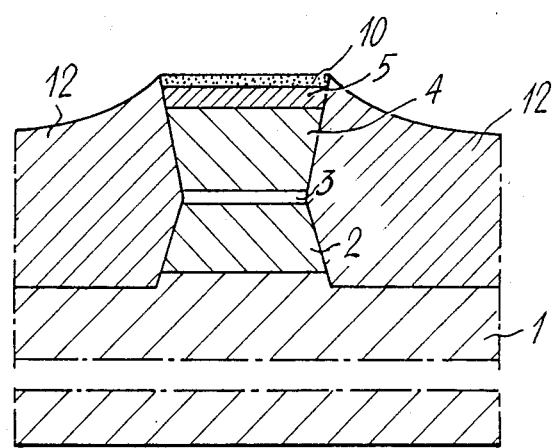

The accompanying figures make it possible to understand the invention better:

FIG. 1 already described, represents a double heterostructure before resumption of epitaxy, FIG. 2 represents the double heterostructure with buried ribbon obtained after putting the process according to the invention into practice.

In the case where the semiconductive compounds consist of the GaAs/GaAlAs pair, the structure represented in FIG. 2 comprises:

a substrate 1 of n+-type GaAs, a first epitaxied confinement layer 2 of N-type $Ga_{1-x}Al_xAs$, an active epitaxied layer 3 of intentionally non-doped GaAs, a second epitaxied confinement layer 4 of P-type $Ga_{1-x}Al_xAs$, contact layer 5 of p-doped GaAs, a zone 10 implanted with p-type doping material at the upper surface of layer 5, a layer 12 of $n^-$-type $Ga_{1-z}Al_zAs$ made during the resumption of epitaxy.

In the case where the resumption of epitaxy is undertaken in liquid phase, the applicants successfully proceeded under the following conditions: the p doping material is zinc with a dosage of $5.10^{14}$ cm$^{-2}$ and an energy of 350 KeV; during the resumption of epitaxy, the growth is achieved with $Ga_{1-z}Al_zAs$ with $z=0.5$. For a cavity length of 270 μm and an active zone width of 3 μm, a threshold current of 12 mA was obtained in pulsed operation. The contact resistances obtained are good, which indicates that the implanted zone was well-annealed during the resumption of liquid epitaxy.

We claim:

1. Process for manufacturing a semiconductor laser having a buried ribbon, in which:

on a substrate (1), there is deposited by epitaxy a first N-doped confinement layer (2), a non-doped active layer (3), a second P-doped confinement layer (4) and a contact layer (5), the group of these layers forming a double heterostructure, by photolithography, a ribbon (7) is delimited on this double heterostructure and an etching on both sides of the ribbon is performed, to the substrate, which allows a mesa to remain on the substrate, a resumption of epitaxy is performed on both sides of the mesa on the parts of the substrate (2) which have been released to cause a semiconductive layer (12) to grow to achieve an optical and electrical confinement of the laser, this process being characterized by the fact that before the photolithography operation, an implantation of a p-type doping material is performed in the entire contact layer (5), which has the effect of rendering the upper surface of the contact layer (5) amorphous, then the process is continued by delimiting the ribbon, etching and resumption of epitaxy.

2. Process according to claim 1, wherein to perform the resumption of epitaxy, epitaxy in liquid phase is undertaken, the crystalline growth then being performed on the substrate (1) on both sides of the mesa, but not on the upper surface (10) of the contact layer (5), which was implanted.

3. Process according to claim 1, wherein to perform the resumption of epitaxy, epitaxy by organometallic chemical vapor deposition of (OMCVD) is undertaken, the crystalline growth then being monocrystalline and wherein the growth layer that appears on the top of the mesa is removed by etching.

* * * * *